(12) United States Patent
Kurzum et al.

(10) Patent No.: US 7,089,521 B2
(45) Date of Patent: Aug. 8, 2006

(54) METHOD FOR LEGALIZING THE PLACEMENT OF CELLS IN AN INTEGRATED CIRCUIT LAYOUT

(75) Inventors: Zahi M. Kurzum, Poughkeepsie, NY (US); Paul Villarrubia, Austin, TX (US); Shyam Ramji, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 232 days.

(21) Appl. No.: 10/766,549

(22) Filed: Jan. 27, 2004

(65) Prior Publication Data

US 2005/0166169 A1 Jul. 28, 2005

(51) Int. Cl.
*G06F 9/45* (2006.01)
*G06F 17/50* (2006.01)

(52) U.S. Cl. ................................. 716/10; 716/2; 716/8
(58) Field of Classification Search ............... 716/1–18
See application file for complete search history.

(56) References Cited

U.S. PATENT DOCUMENTS

| | | | | |
|---|---|---|---|---|
| 5,619,419 A * | 4/1997 | D'Haeseleer et al. | ........... | 716/8 |
| 5,943,243 A | 8/1999 | Sherlekar et al. | | |
| 6,415,426 B1 * | 7/2002 | Chang et al. | ................... | 716/9 |
| 6,480,991 B1 * | 11/2002 | Cho et al. | ....................... | 716/8 |
| 6,779,169 B1 * | 8/2004 | Singh et al. | ................... | 716/16 |
| 6,857,115 B1 * | 2/2005 | Dasasathyan et al. | .......... | 716/9 |
| 6,948,143 B1 * | 9/2005 | Donelly et al. | ................ | 716/9 |

OTHER PUBLICATIONS

M.A. Breuer, "Min-cut Placement"; IEEE Design Automation and Fault-Tolerant Computing, pp. 343-382, Oct. 1977.
H. Yang et al., "Efficient network flow based min-cut balanced partitioning"; Proceedings of the IEEE/ACM Int. Conf. Computer-Aided Design, pp. 50-55, 1994.
H. Eisenmann et al. "Generic Global Placement and Floorplanning"; Proceedings of IEEE/ACM Design Automation Conference, pp. 269-274, 1998.

(Continued)

*Primary Examiner*—Vuthe Siek
*Assistant Examiner*—Nghia M. Doan
(74) *Attorney, Agent, or Firm*—H. Daniel Schnurmann

(57) ABSTRACT

A method for resolving overlaps in the cell placement (placement legalization) during the physical design phase of an integrated chip design is described. This problem arises in several contexts within the physical design automation area including global and detailed placement, physical synthesis, and ECO (Engineering Change Order) mode for timing/design closure The method involves capturing a view of a given placement, solving a global two-dimensional area migration model and locally perturbing the cells to resolve the overlaps with minimal changes to the given placement. The method first captures a two-dimensional view of the placement including blockage-space, free-space and the given location of cells by defining physical regions. The desired global area migration across the physical regions of the placement image is determined such that it satisfies area capacity-demand constraints. The method also provides moving the cells between physical regions along previously computed directions of migration to minimize the movement cost. Also provided is an approximate method to model the movement of multi-row high cells.

19 Claims, 7 Drawing Sheets

OTHER PUBLICATIONS

Sun et al. "Efficient and Effective Placement for Very Large Circuits"; IEEE Transactions on Computer-Aided Design, pp. 349-359, 1995.

K. Doll et al., "Accurate net models for placement improvements by network flow methods"; Proceedings of IEEE/ACM Int. Conf. on Computer-Aided Design, pp. 594-597, 1992.

Jens Vygen, "Algorithms for Detailed Placement of Standard Cells"; Proc. of Design Automation and Test in Europe (DATE), pp. 321-324, 1998.

S. Hur et al., "Mongrel: Hybrid Techniques for Standard Cell Placement"; Proceedings of IEEE/ACM International Conference on Computer-Aided Design, pp. 165-170, 2000.

* cited by examiner

Supply Nodes
$b(i) > 0$

Demand Nodes
$b(j) < 0$ $\forall i \; if \, b(i) > 0,$
$Cap(e_{si}) = b(i)$
$Cost(e_{si}) = 0$ $\forall i \neq s, j \neq t,$
$Cap(e_{ij}) = \textit{Infinity}$ (Large Int)
$Cost(e_{ij}) = K_{e_{ij}}$ $\forall j \; if \, b(j) < 0,$
$Cap(e_{jt}) = -b(j)$
$Cost(e_{jt}) = 0$ $\forall$ : Notation represents the meaning *"For Every Element"*
$\in$ : Notation represents the meaning *"Element of"*

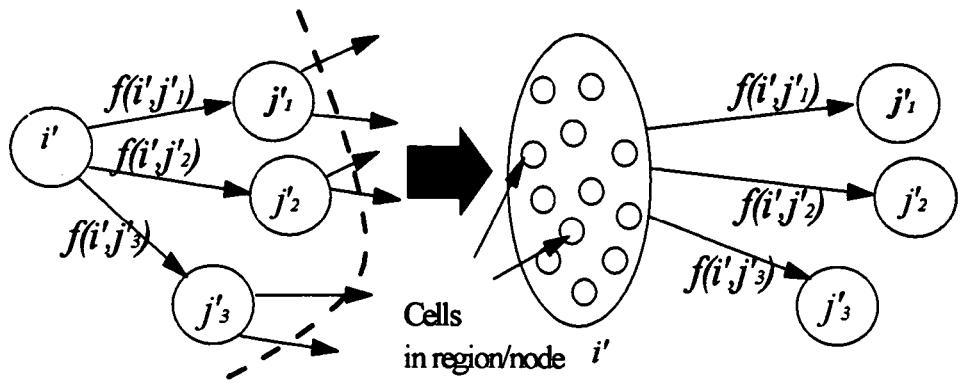

Figure 5

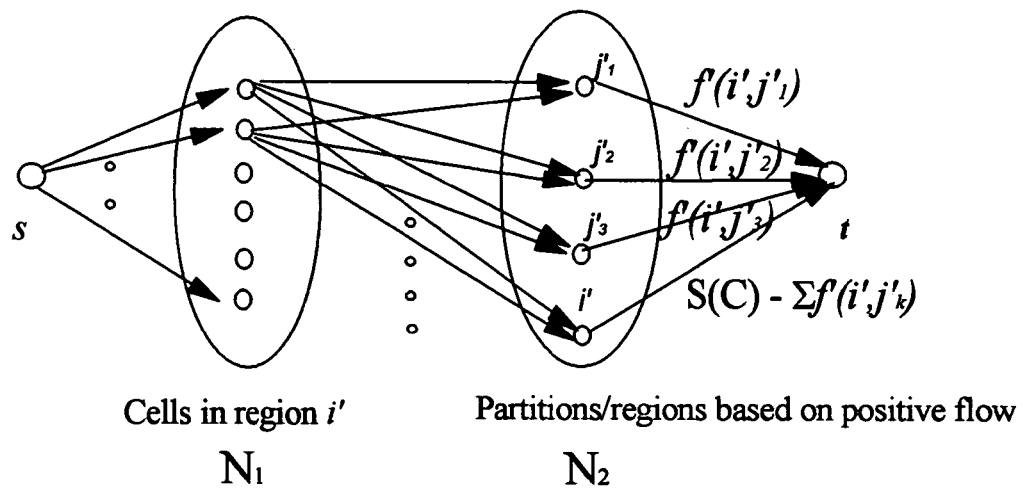

Cells in region $i'$     Partitions/regions based on positive flow $N_1$     $N_2$ $S(C)$ = Total size of cells in region $i'$ $\forall i \in N_1$
$\mathrm{Cap}(e_{si}) = 1$
$\mathrm{Cost}(e_{si}) = 0$ $\forall i \in N_1, j \in N_2$
$\mathrm{Cap}(e_{ij}) = 1$
$\mathrm{Cost}(e_{ij}) = $ Cost of moving cell $i$ to region $j$
multiplier $\mu_{ij}$ = size of cell $i$ $\forall j \in N_2$
$\mathrm{Cap}(e_{jt}) = $ flow to region $j$
$\mathrm{Cost}(e_{jt}) = 0$ $\forall$ : Notation represents the meaning "For Every Element"
$\in$ : Notation represents the meaning "Element of"

Figure 6

∀ : Notation represents the meaning "For Every Element"

```
Placement_Aware_Region_Definition ()
Begin
1   Build placement image
2   For each circuit row r in the layout
    Begin
3       scanline_x = row_xlow (r); last_region_boundary = row_xlow (r);
4       leading_free_space = false;
5       S = sorted list of cells in row r by increasing position along x-direction
        c = first cell in sorted list S
6       while (c)
        Begin
7           If (xpos(c) > scanline_x)
            Begin
8               If (xpos(c) - last_region_boundary > W)
                Begin
9                   p = create_region (r, last_region_boundary+W, last_region_boundary)
10                  scanline_x = (last_region_boundary+ = W)
                End
11              Else
                Begin
12                  If (is_fixed_cell(c) || is_blockage(c) || leading_free_space)
                    Begin
13                      p = create_region (r, xpos(c), last_region_boundary)
14                      scanline_x = last_region_boundary = xpos(c)
15                      leading_free_space = false
                    End
16                  Else if (xpos(c) - scanline_x >= 0.50 * W and scanline_x > last_region_boundary)
                    Begin
17                      p = create_region (r, scanline_x, last_region_boundary)
18                      last_region_boundary = scanline_x
19                      leading_free_space = true
                    End
20                  Else  scanline_x = xpos(c)
                End
            End
21          Else if (xpos(c) == scanline_x)
            Begin
22              If (is_fixed_cell(c) || is_blockage(c))
                Begin
23                  p = create_region (r, xpos(c) + width(c), scanline_x)
24                  scanline_x += width(c)
25                  last_region_boundary = scanline_x
                End
26              Else if (is_movable_cell(c))
                Begin
27                  If (xpos(c) + width(c) <= W)
28                      scanline_x += width(c)
29                  Else
                    Begin
30                      p = create_region (r, xpos(c) + width(c), last_region_boundary)
31                      last_region_boundary = scanline_x
32                      scanline_x += width(c)
                    End
                End
33          c = next cell in the sorted list S
        End
    End
End
```

Figure 9

Global_Area_Migration_Graph ($G(V,E)$)

Begin

1. $V$ = {regions}, $E$ = {edge between neighboring regions}
2. $\forall\ e \in E$, Cost($e$) = $K_e$
3. $\forall\ e \in E$, Cap($e$) = *Infinity* (Large integer)
4. $\forall\ v \in V$, Size($v$) = Total size of movable cells in $v$
5. $\forall\ v \in V$, Cap($v$) = Total available space for movable cells in $v$ (i.e. region)
6. $\forall\ v \in V$, b($v$) = Size($v$) - Cap($v$)
7. If b($v$) > 0, $v$ is a supply node.
8. If b($v$) < 0, $v$ is a demand node.
9. If b($v$) = 0, $v$ is a transshipment node.

End

$\forall$ : Notation represents the meaning *"For Every Element"*
$\in$ : Notation represents the meaning *"Element of"*

Figure 10

Generalized_Flow_Graph (region $i'$)

Begin

1. $N_1$ = {cells in region $i'$}, $N_2$ = {$i'$} U {*neighboring regions*}
2. $E$ = {edge representing cell-to-region assignment}
3. $S(N_1)$ = Total size of cells in $N_1$ (region $i'$)
4. $Smallest(N_1)$ = Smallest cell size in $N_1$ (region $i'$)
5. *Introduce an edge from $N_1$ to $N_2$ for every possible cell-to-region assignment,*

$\forall i \in N_1, j \in N_2$, $Cap(e_{ij}) = 1$ $\forall i \in N_1, j \in N_2$, *multiplier*, $\mu_{ij}$ = *size of cell i*

$\forall i \in N_1, j \in N_2$, $Cost(e_{ij})$ = *Cost of moving cell i to region j*

6. *Introduce source node s, with edges such that*

$\forall i \in N_1$, $Cap(e_{si}) = 1$ $\forall i \in N_1$, $Cost(e_{si}) = 0$

7. *Introduce sink node t, with edges such that*

$\forall j \in N_2$, $Cap(e_{jt}) = f'(i',j) = MAX(Smallest(N_1), f(i',j))$, If $f(i',j) > 0$ $\quad\quad\quad\quad\quad\quad\quad\quad\quad\quad\quad\quad\quad$ 0, Otherwise $\forall j \in N_2$, $Cost(e_{jt}) = 0$

End

$\forall$ : Notation represents the meaning *"For every element"*

$\in$ : Notation represents the meaning *"Element of"* (*a set theory notation*)

Figure 11

METHOD FOR LEGALIZING THE PLACEMENT OF CELLS IN AN INTEGRATED CIRCUIT LAYOUT

BACKGROUND OF THE INVENTION

This invention is generally related to the field of Electronic Design Automation as it applies to the design of semiconductor chips and, more generally, to a method for placing cells in a VLSI chip and legalizing the process with a minimal amount of disturbance to the cell placement.

Typical stages in an integrated circuit (i.e., IC's or VLSI chips) design flow include logic synthesis, floorplanning, placement, routing and timing analysis steps. The placement phase of physical design is of paramount importance given the impact of placement solution on design metrics like area, routability and timing. The cell placement problem is among the most fundamental in VLSI physical design and has been extensively researched over the past two decades. In the context of standard cells, the classical wire-length driven formulation can be stated as follows: given a netlist of standard cells, each component is assigned to a row and to an x-position in that row such that no two cells overlap and that the estimated wire length is minimized.

Placement techniques can be broadly classified as:
1) partitioning-based methods as described, e.g., in the article "Min-cut Placement" by M. A. Breuer, published in the Proc. of IEEE Design Automation and Fault-Tolerant Computing, pp. 343–382, October 1977, and in the article "Efficient network flow based min cut balanced partitioning," H. Yang and D. F. Wong, published in the *Proceedings of the IEEE/ACM Int. Conf. Computer-Aided Design*, pp. 50–55, 1994.
(2) analytical placement methods, as described in the article "Generic Global Placement and Floorplanning," by H. Eisenmann and F. M. Johannes, published in the *Proceedings of IEEE/ACM Design Automation Conference*, pp. 269–274, 1998; and
(3) annealing-based methods, as described in the article "Efficient and Effective Placement for Very Large Circuits," by W-J. Sun and C. Sechen, published in the *IEEE Transactions on Computer-Aided Design*, pp. 349–359, 1995.

Most top-down large-scale placement techniques (like partitioning and analytical methods) divide the placement stage into global and detailed placement phases. The global placement phase assigns cells to global bins in a grid imposed over the layout area, and thereby decides the global ordering of cells. The detailed placement phase determines the exact cell locations through local perturbations to minimize a desired objective function.

Placement legalization specifically involves resolving overlaps in cell placement during the physical design phase. In general, placement legalization is a required step in several placement approaches to arrive at a valid overlap-free placement that satisfies design rule constraints. The input to the legalization phase is an overlapping placement configuration and the desired output is an overlap-free placement with minimal perturbation to cell locations. Overlap-removal techniques can be used within the context of both global and detailed placement algorithms that generate intermediate overlapping cell placement solutions requiring coarse or fine legal assignment.

Placement legalization is also vital in the context of physical synthesis, wherein the logic/netlist is changed to correct timing violations that invariably result in cell overlaps. In this scenario, it is desirable that any given cell does not move a large distance from the current location to find a legal placement slot, thereby minimizing the impact on the final timing results. The strength of the overall approach to correct timing through synthesis and placement transforms depends on the placement legalization technique that can effectively realize the solutions with minimal placement changes. Other physical design applications requiring an Engineering Change Order (ECO) facility from placement tools also benefit from such techniques that legalize the placement.

The method presented in the invention directly addresses such overlap-removal techniques.

Terminology:

Some standard terminology and definitions from literature are presented for clarity of content and to be utilized hereinafter:

Graph: A graph $G=(V, E)$ consists of a set of objects $V=\{v_1, v_2 \ldots \}$ called vertices (or nodes), and another set $E=\{e_1, e_2 \ldots \}$, whose elements are called edges, such that each edge $e_k$ is identified with an unordered pair $(v_i, v_j)$ of vertices. The vertices $v_i, v_j$ associated with edge $e_k$ are called the end vertices of $e_k$. The most common representation of a graph is a diagram, in which the vertices are represented as points and each edge as a line segment joining its end vertices.

Details on the use of graphs may be found in the textbook Graph Theory with Applications to Engineering and Computer Science. Narsingh Deo, *Prentice-Hall Publications*, 1974.

Directed Acyclic Graph (DAG): A directed graph G consists of a set of vertices $V=\{v_1, v_2 \ldots \}$, a set of edges $E=\{e1, e_2 \ldots \}$, and a mapping that maps every edge onto some ordered pair of vertices $(v_i, v_j)]$.

Shortest Path: In the simplest form, a shortest path is referred to as the path from a given source vertex to a given destination vertex having the least distance (cost).

Depth First Search: As quoted from the aforementioned reference by Narsingh Deo, a depth-first search is a systematic traversal of the edges of a given graph such that every edge is traversed exactly once and each vertex is visited at least once.

Topological Order: The vertices of a directed graph G are said to be in topological order if they are labeled 1, 2, 3, . . . ,n such that every edge in G leads from a smaller numbered vertex to a larger one.

Maximum Flow Problem: Given a network with capacities on edge flows, the maximum flow problem seeks to find a solution to send as much flow as possible between two points in the network while honoring the edge flow capacities. Further details may be found in the textbook "Network Flows: Theory, Algorithms, and Applications", R. K. Ahuja, T. L. Magnanti, J. B. Orlin, *Prentice-Hall Publications*, 1993.

Minimum Cost Flow: Given a cost per unit flow on a network edge in addition to edge capacities, the minimum cost flow problem solves for the units of flow to be sent from one point in the network (the source) to one or more points in the network (sink) with minimum cost while honoring the edge flow capacity.

Area Migration: In the context of the present invention, area migration refers to the movement of standard cell area units from one region to another of a VLSI layout.

Manhattan Distance: The distance between two points measured along axes at right angles. In a plane with point $p_1$ at $(x_1, y_1)$ and point $p_2$ at $(x_2, y_2)$, the manhattan distance is given by $|x_1-x_2|+|y_1-y_2|$.

The need for placement legalization arises in almost all physical design flows. Several legalization approaches have been adopted in prior works that generally suffer from the following drawbacks: (a) typically use local search heuristics that does not have a global placement view; (b) disturb the given placement (order) significantly leading to inferior placement solution; and (c) do not behave well under difficult instances that have several cell overlaps in the same proximity or fail to legalize under these circumstances.

Among the notable overlap removal methods proposed in the prior art is described in U.S. Pat. No. 5,943,243 which proposes a row level legalization approach, wherein cells are reassigned from over-capacitated regions to free-spaces between fixed-blocks. However, their method attempts a cell-by-cell legalization scheme with restricted local search and does not incorporate a global view of free-space contention, thereby, resulting in large movement of some cells to find a legal placement.

In another approach, described in U.S. Pat. No. 5,619,419, an analytical placement algorithm incorporating overlap removal through repulsive forces to spread cells apart is presented. Such a recursive approach to eliminate cell overlaps is often applied in many top-down placement algorithms but do not lend them for a post-placement legalization scheme.

There also exists some reference to overlap-removal techniques found in the literature, notably: modeling a detailed placement algorithm as a transportation problem which is solved using network flow techniques, as described in the article "Accurate net models for placement improvements by network flow methods," by K. Doll, F. M. Johannes, and G. Sigl, published in the *Proc. IEEE/ACM Int. Conf. on Computer-Aided Design*, pp. 594–597, 1992. Although this approach maintains non-overlapping placement, it does not explicitly address placement legalization issues since the input placement is assumed to be overlap-free. In addition, the aforementioned approach does not globally explore the available free-space in the layout area for cell placement assignment. A detailed placement algorithm using a network-flow based approach to migrate cells from overpopulated regions to free-space with minimal perturbation is described in "Algorithms for Detailed Placement of Standard Cells," Jens Vygen, published in the *Proc. of Design Automation and Test in Europe* (DATE), pp. 321–324, 1998. However, this modeling restricts the flow (movement) of cells to only the vertical direction across rows of regions and does not account for the horizontal movement of cells while satisfying global capacity and demand constraints. A legalization scheme that uses gain-graph model to ripple move cells to an overlap-free position in the context of detailed placement is presented in "Mongrel: Hybrid Techniques for Standard Cell Placement," S. Hur and J. Lillis, published in the *Proc. IEEE/ACM International Conference on Computer-Aided Design*, pp. 165–170, 2000. This method is applicable for resolving single-source overlaps caused by individual cell moves during placement refinement but does not handle multiple regions with overlaps simultaneously.

The approaches presented in the prior art either do not directly address the post-placement legalization problem or they fail to capture the global-view of the problem or they do not account for all the degrees of cell movement in the global-view context. The present invention proposes a two-dimensional model of the given placement instance as a global area migration problem where both horizontal and vertical movement of cells (area units) is effectively captured. Furthermore, efficient techniques to move cells to satisfy the desired area migration across regions with minimal perturbation from the given placement are also disclosed. The proposed approach provides a robust solution to legalize cell placement without compromising on the placement quality.

OBJECTS AND SUMMARY OF THE INVENTION

Accordingly, there is provided a method for resolving overlaps in the cell placement, during the physical design phase of a chip design to preserve the quality of the placement.

It is another object of the invention to provide an efficient method to automatically resolve cell overlaps by capturing a globally-aware two-dimensional area-migration solution followed by local perturbations to the given placement.

It is yet another object of the invention to provide a method for legalizing the given placement with minimal disturbance to the cell placements.

These and other objects of the invention are achieved by an overall flow for the proposed legalization scheme that involves three major phases: (a) solving a global area migration problem, followed by, (b) detailed physical movement of cells, and (c) local relative placement order optimization. The core concept captures a globally-aware solution while making local detailed changes to remove cell overlaps.

The first step attempts to capture the given placement instance as a two-dimensional model reflecting blockages, free-space and placement of movable cells. The goal is to identify the regions of overlap (supply points with excess assignment), regions of free-space (demand points with available space in the layout), and regions with zero-capacity (blockages and fixed objects) along with accurate cost per-unit area (unit cell area) movement in both horizontal and vertical directions. The desired area-migration from over-populated regions to the under-utilized regions to satisfy the capacity demand constraints with minimal overall cost of cell area migration can be represented as a linear programming problem. This instance of the linear program is efficiently solved using network flow techniques. The solution to the global problem represents the effective units of area to be migrated between regions in the layout area with minimal overall movement cost. The second step in the legalization process involves physical movement of cells from each region to its neighboring regions to satisfy the desired amount of area migration determined in the global phase while minimizing the cell movement cost. The cells are assigned a detailed location in the target region as they are physically moved during this phase of legalization. At this point, most cells have been assigned a valid overlap free placement; however, some cells may exist that cannot be legalized based on the current global assignment. To eliminate any existing cell overlaps, the first two steps are iterated until an overlap-free cell assignment is achieved for the entire layout. The third and final step involves local cell reordering to improve placement objectives like weighted linear wirelength.

The invention provides a method for resolving cell placement overlaps in an integrated circuit that includes the steps of: a) determining an initial placement of the cells; b) capturing the placement-view including blockage-space and free-space to define in an image space physical regions of the integrated circuit; c) constructing a network flow model representing the movement of the cells between the physical regions; d) solving the network flow model to determine a desired flow of the cells between the physical regions of the integrated circuit; and e) realizing the best approximation of the desired flow of cells.

BRIEF DESCRIPTION OF THE DRAWINGS

The accompanying drawings, which are incorporated in and which constitute part of the specification, illustrate presently a preferred embodiment of the invention and, together with the general description given above and the detailed description of the preferred embodiment given below; serve to explain the principles of the invention.

FIG. 5 shows a detailed cell movement from region i'.

FIG. 6 illustrates the generalized min-cost flow formulation per region.

FIG. 9 describes the process for placement aware region definition

FIG. 10 illustrates the graph model formulation for the global area migration problem.

FIG. 11 illustrates the graph model for cell selection problem per region

DETAILED DESCRIPTION OF THE INVENTION

Figure 1:
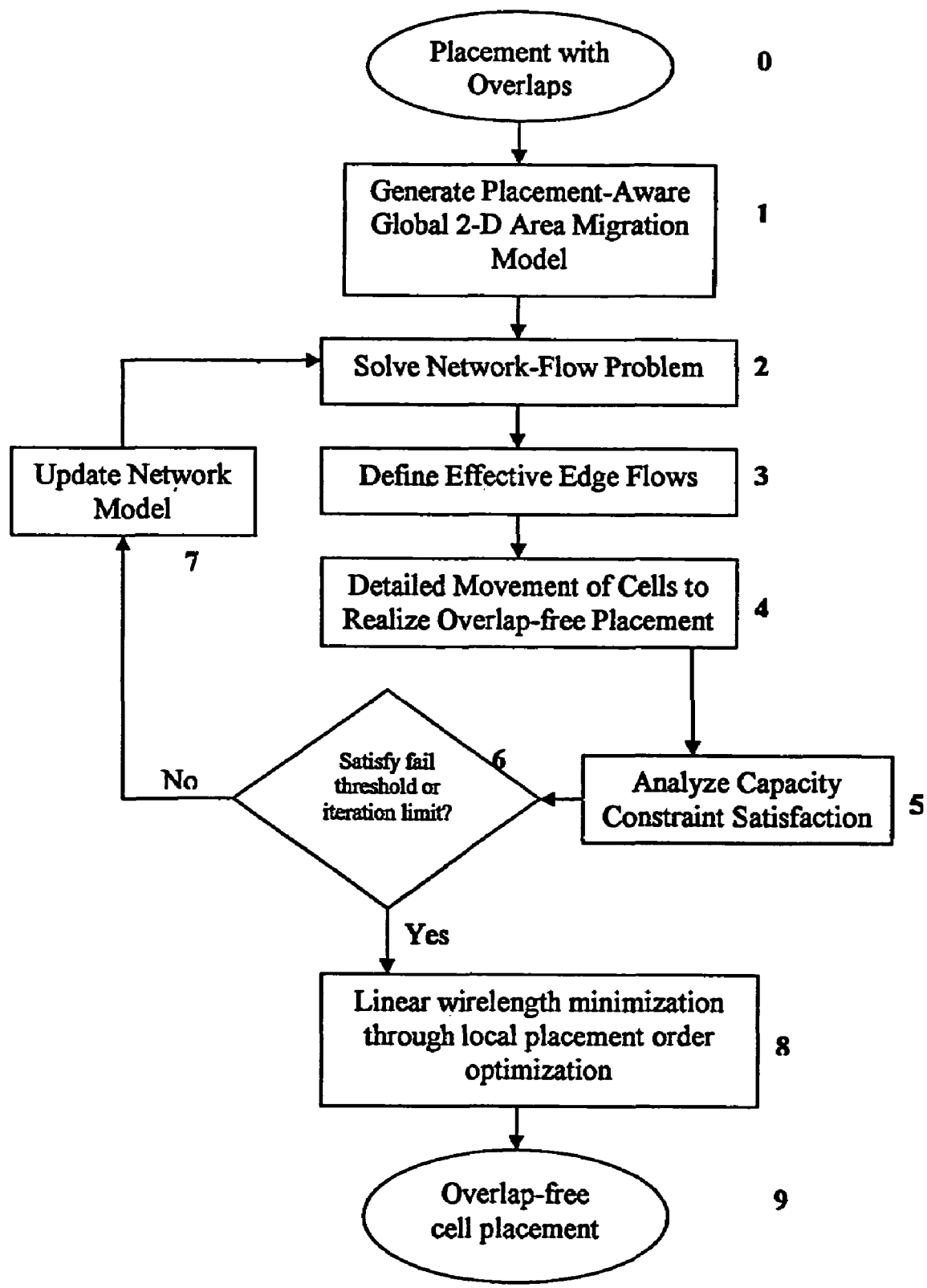
FIG. 1 shows a flow chart for the method for legalizing the placement of cells in a chip according to the present invention.

The flow chart for the proposed legalization (FIG. 1) describes the steps (1 through 8) involved in the present invention. Each step in the flow chart is described independently in detail in the following sections:

Step 1: Modeling Placement-Aware Global 2-D Area Migration Problem

The first step in the proposed legalization scheme represents a given placement instance as a global two-dimensional area migration problem. This involves two parts: (a) placement-aware region definition and (b) flow graph model of the 2-D area migration problem.

Figure 2:
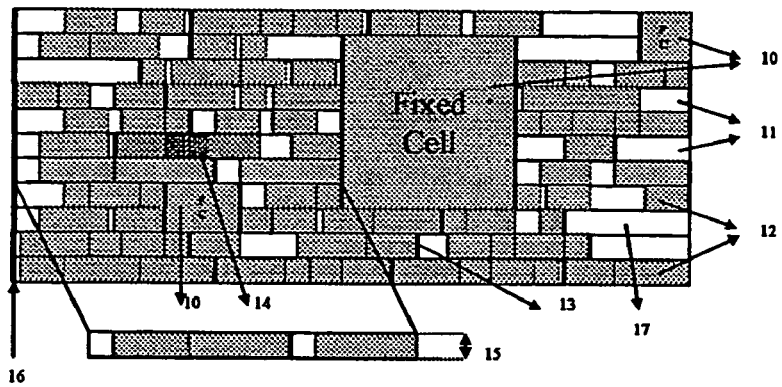
FIG. 2 illustrates the definition of a placement-aware region.

(a) Placement-aware region definition involves creating a model of a given placement instance reflecting regions of overlap (14, supply points with excess assignment), regions of free-space (17, demand points with available space in the layout), and regions with zero-capacity (10, blockages and fixed objects), all of which are illustrated in FIG. 2. Shown therein is a physical representation of the region definition scheme for a given placement. The large blocks (10) are fixed cells or blockages in the placement image space. The horizontal rows (11) represent the circuit rows with height h (15), which is typically fixed in a standard cell based design methodology for ASIC chips. The vertical demarcation lines (13) represent region boundaries that vertically slice the circuit rows to divide the row width into some reasonable sized regions. The vertical region boundaries (13) are defined such that they reflect blockages (10), contiguous free-space (17) and placement of movable cells (12), thereby capturing a per-unit area movement cost in both, the horizontal and vertical directions as accurately as possible. Furthermore, such a placement-aware region definition facilitates physically realizable global solutions and avoids unnecessary movement of cells (area) across regions. Each layout area that is formed by the horizontal and asymmetrical vertical grid lines defines a "region" or "bin". Also, for the present, it is assumed that all multi-row high cells are fixed in location and so, the initial legalization problem involves moving only single-row high cells. FIG. 9 shows the pseudo-code for the scan line based region definition process where the default width of regions is set to W (that is, no contiguous space other than that occupied by blockages and fixed objects having a region width greater than W). The space occupied by fixed objects and blockages in a row are further vertically sliced into regions of equal width (less than or equal to W) to accurately model the cell movement cost over them. The value of W is computed based on the design size and average movable single-row-high cell size in the design.

The first step in the region definition process (step 1, FIG. 9) builds the placement image by assigning cells to rows (y-position) and their given x-position. Large fixed cells and blockages are represented as a collection of single row-high cells. The scanline based method defines the regions on a row-by-row basis (step 2, FIG. 9) by advancing the scanline from the left boundary (step 3, FIG. 9) to the right boundary of the each row. The scanline advances based on a given placement of cells (movable, fixed and blockages) of the row concerned. Therefore, the list of cells in a row sorted by their x-position (step 5, FIG. 9) is sequentially processed (step 6, FIG. 9) to define the region boundaries within a row. The left edge position of each cell (c) is represented by xpos(c), the scanline position by scanline_x and the previous region boundary by last_region_boundary. The sequential loop advances the scanline to either the left edge position of the current cell, xpos(c) (as in step 20, FIG. 9) or to the right edge position of the current cell (as in steps 24, 28 and 32, FIG. 9). The scanline progresses forward until it hits either a fixed cell in the row or it exceeds the predefined width constraint W. If a fixed cell is encountered, then a region is defined to the left of the fixed cell based on scanline_x and the previous region boundaries (step 13, FIG. 9). The scanline is advanced to the left edge of the fixed cell (steps 14, 15, FIG. 9). If the width constraint is violated as the scanline advances, then a region is defined based on the previous region boundary and the scanline_x value before the scanline is advanced (steps 9, 10, and 17, 18, 19, FIG. 9). When scanline coincides with the left edge of a fixed cell, then entire width of the fixed cell is captured as a region and the scanline is advanced forward to the right edge of the fixed cell (steps 23, 24, 25, FIG. 9). The scanline is simply advanced by the width of any movable cell that is encountered if the width constraint is not violated (steps 27, 28, FIG. 9). A region is created between the current feasible position and the previous region boundary whenever width constraint is violated by the position or width of any cell (as in steps 30, 31, and 32, FIG. 9). The complexity of the region definition phase is O (n log n), where n is the number of cells in the design.

(b) Flow graph model of the two-dimensional area migration problem is constructed from the above set of regions to define the capacity-demand constraints for the given placement view. It results in a directed graph, wherein nodes are defined by the regions (or bins) and the edges (direction of potential movement of area) are defined between neighboring regions that overlap at least partially in one of horizontal or vertical direction. For each region b, neighboring regions as those which adjoin region b are defined. Each such adjacency (neighboring relation) is represented by a directed edge from region b to its neighbors. So, as a general case, for a pair of neighboring regions (b1, b2), there exists a pair of directed edges going from b1 to b2 and from b2 to b1.

Figure 3:
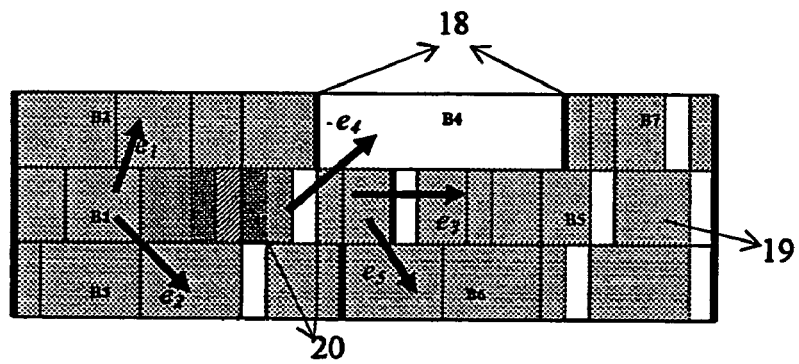
FIG. 3 illustrates the unit-cell-area movement cost.

Referring now to FIG. 3, there is shown a snapshot of regions that illustrates the analogy of edges between nodes in the flow graph and adjacency (neighboring) relationship in the placement view. The figure shows seven regions (B1, B2, B3, B4, B5, B6 and B7) with region boundaries (18) and placement of movable cells (19) in each region including some cell overlaps (20) in region B1. The regions adjoining B1 are represented in the corresponding graph model through edges $e_1$ (B1, B2), $e_2$ (B1, B3), $e_3$ (B1, B5), $e_4$ (B1, B4) and $e_5$ (B1, B6). These edges have attributes similar to the edge cost and edge capacity. The edge cost represents the cost per unit cell area movement along that direction and the edge capacity reflects the maximum allowed cell area flow in that direction. All the edges e $(v_i, v_j)$ in the graph have a cost $K_e$, which is the cost of moving unit commodity from node (region) $v_i$ to its neighboring node (region) $v_j$, where the cost $K_e$ is defined by $$\forall e(v_i, v_j) \in E,$$
$$\text{Cost}(e) = K_e = \begin{cases} \text{Width}(v_i)/2, & \text{If } \text{row}(v_i) = \text{row}(v_j) \\ \text{Height}(v_i) + \alpha * \text{Width}(v_i)/2, & \text{If } \text{row}(v_i) \neq \text{row}(v_j) \end{cases}$$

and the overlap factor ($\alpha$) between the two regions $v_i$ and $v_j$ by $$\alpha = 1 - \frac{\text{Overlap Width}(v_i, v_j)}{\text{Width}(v_i)}$$

As previously mentioned, the cost per unit area migration associated with an edge captures the physical disposition of neighboring regions. The capacity of all the edges e $(v_i, v_j)$ in the graph is set to infinity (i.e., a large integer) to allow unlimited movement of cells in and out of each region to satisfy the global capacity-demand constraints.

FIG. 10 depicts a graph model for the global area migration problem. The regions in the placement image define the set of nodes V in the graph. The neighboring regions relationship is captured by the set of edges E in the graph (step 1, FIG. 10). Every edge e that is an element of the set E of edges, has two attributes associated therewith: the capacity of the edge, given by Cap(e), that represents the maximum flow allowed in that direction (step 3, FIG. 10), and the cost of unit flow along the edge direction given by the Cost(e) (step 2, FIG. 10). These attributes are assigned values as described previously. Each node v that is an element of the set V of nodes, has two attributes associated with it: the capacity of the node v, given by Cap(v), represents the capacity of the region corresponding to the node v (step 5, FIG. 10); and the total size of the cells occupying the region corresponding to the node v, given by Size(v) (step 4, FIG. 10).

Consequently, each node v also has an effective excess/deficit number associated with it, given by b(v), and is the difference between the Size(v) and Cap(v) (step 6, FIG. 10). If b(v) is positive, then node v represents a supply node (region with excess assignment). If b(v) is negative, then node v represents a demand node (region with deficit or available free space).

Step 2: Solving the Network Flow Formulation

Figure 4:
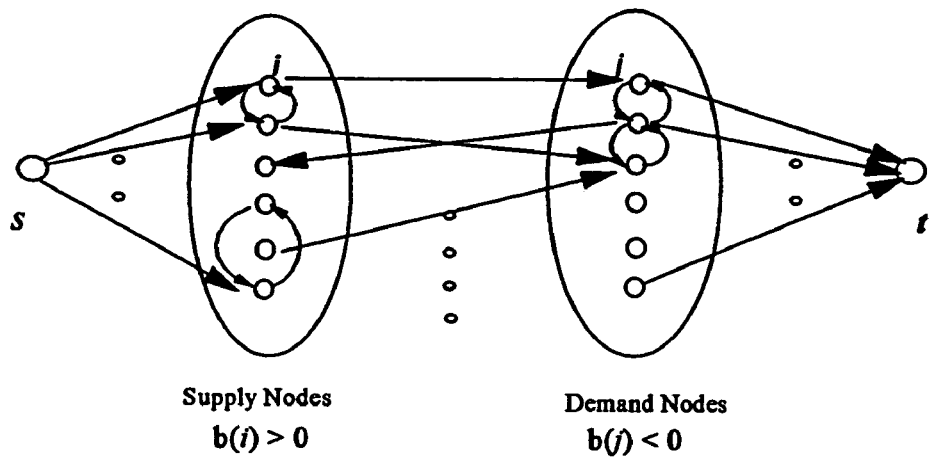
FIG. 4 shows the problems associated with a network flow model for a two-dimensional area migration.

The above graph is now transformed by introducing a source node s and a sink node t. The transformation involves introducing zero cost edges from source node s to all the supply nodes i (Cost($e_{si}$)=0, Cap($e_{si}$)=b(i)) and zero cost edges from demand nodes j to sink node t (Cost($e_{jt}$)=0, Cap($e_{jt}$)=-b(j)), as illustrated in FIG. 4. The minimum cost global area migration solution is obtained by solving a minimum-cost flow problem on the transformed graph using known network flow techniques. These are known optimal algorithms, as described in the textbook "A faster strongly polynomial minimum cost flow algorithm", James B. Orlin, *Operations Research* 41, 1993, having a complexity of O (n log n (m+n log n)), where n is the number of nodes in the graph and m is the number of edges in the graph. The solution obtained from solving this network problem defines the extent of the area migration required between nodes (regions) to reach a capacity satisfying assignment of cells to regions with minimum overall movement cost.

Step 3: Define Effective Edge Flows

Since the graph consists of two-way directed edges between adjacent nodes (neighboring regions), the effective edge flow is determined by scanning for the total net flow from one node to its neighbor. Following this step, a unique non-negative (greater than or equal to zero) flow direction between a pair of nodes that are adjacent is obtained.

Step 4: Detailed Movement of Cells

This step involves processing individual regions to physically move cells (cell area) to the neighboring regions based on the desired global area migration solution. The order in which the regions are processed is determined by the topological ordering of the global directed acyclic graph based on the positive effective edge flows. The inventive method for detailed movement of cells from each region involves three parts: (a) the cell selection problem, (b) the physical movement of cells, and (c) updating area migration values.

(a) For each region in the topological order, the aim is to select a set of cells from the current region to be moved to the neighboring regions to satisfy the desired flow amount in the edge while minimizing the total cost of moving cells. For each cell assigned to the current region i', the original location of the cell is known a priori. The target location in the neighboring region is computed to be the closest point within the new region from the current region boundary. With these two positions known, the cell movement cost is computed as the square of the manhattan distance between the two positions (quadratic movement cost). Therefore, for the region i', the problem is to determine what cells to move and in which direction (the neighboring region) based on the associated movement costs.

Referring to FIG. 5, there is shown an example of region i' having positive flows (area migration) to neighboring regions $j_1', j_2', j_3'$ with corresponding flows of f(i',$j_1'$), f(i',$j_2'$) and f(i', $j_3'$). The inventive cell selection method per region attempts to realize the desired area migration to all the neighboring regions simultaneously to minimize the total cell movement cost. This is modeled as a generalized minimum-cost flow problem as shown in FIG. 11. The cells in region i' define the set $N_1$ and the neighboring regions (to i') along with region i' that defines the set $N_2$ (step 1, FIG. 11). The set of edges E represents all possible combinations of cells-to-regions assignment (step 2, FIG. 11). Let $S(N_1)$ represent the total size of cells in the region i' and Smallest $(N_1)$ represent the smallest cell size in the set $N_1$. Every edge e that is element of set E of edges have three attributes associated therewith: the capacity of the edge, given by Cap(e), is set to a unit value (one) representing an assignment of the cell to the corresponding region; the multiplier which represents the gain in flow through the edge e; and the cost of assigning the cell to the corresponding region, given by Cost(e) (step 5, FIG. 11). This graph is transformed by introducing a source node s and sink node t. Additional edges are introduced from the source node s to all the nodes/cells in the set $N_1$ with zero edge cost and unit edge capacity (step 6, FIG. 11). Similar edges are introduced from the nodes/regions in the set $N_2$ to the sink node t with zero edge cost and the capacity defined by the smallest cell size (Smallest($N_1$)) and the desired flow to the corresponding region in set $N_2$ (step 7, FIG. 11).

FIG. 6 illustrates the graph model for the previously mentioned formulation. The problem is solved using modified successive shortest path algorithm (a technique to solve minimum-cost flow). Since the cells are of fixed widths (area) and the desired flows (area migration) in each direction is a real number, it is sometimes impossible to match the exact flow desired in each direction. The modified network flow implementation is to accommodate for the fact that sometimes there might exits no feasible solution which satisfies both the node-balance and the flow-bound constraints in the network. In such instances, the solution to violate the flow-bound constraints is allowed to converge towards a minimal total cost assignment with some area (desired flow) violations. The desired flow constraint is relaxed to accommodate instances where the desired flow (area migration) in a given direction is smaller than the smallest cell area in the region (step 7, FIG. 10). The complexity of this phase is $O(n^2 S(n,m,nC))$, where n is the number of cells in the region, and $S(n,m,nC)$ is the order of time for computing shortest path from source s to sink t in the graph.

Given the possibility of failure to satisfy the desired flow constraints due to discreteness in the cell sizes, an alternative approximation scheme is also presented which primarily selects cells to be moved only based on movement cost. The scheme involves first generating pairs $(c_i, b_j)$ representing assignment of cell $c_i$ to region $b_j$ with Cost $(c_i, b_j)$ representing the corresponding movement cost (quadratic movement cost). The number of such pairs is bounded by O (nR), where n is the number of cells in the region and R represents the bound on the number of neighboring regions. R is typically a small number. The next step in the approximation scheme involves sorting these pairs in the increasing order of cost. The complexity of this step is $O((nR) \log (nR))$. For each pair in the ordered list, the cell is assigned to the corresponding region if assigning the cell area to the region does not violate the desired flow area constraint. If a pair is accepted for assignment, then all the other potential assignments for the given cell are invalidated. This update operation can be performed in O(R) by maintaining suitable data structures on the cells. Therefore, one pass of the sorted sequence assigns cells to regions with minimum individual movement cost while satisfying the desired area flow constraint. However, all the excess area from the active region may not be sent out after the first pass. Therefore, a second pass of the sorted list is performed involving assignment of cells to regions even if they exceed the desired flow constraint. However, in this pass, each region is marked saturated after the very first cell assignment that exceeds the flow constraint. Saturated regions are eliminated from any further cell assignments. At the end of this approximation scheme, cells are assigned to the neighboring regions to satisfy (or exceed) the desired area flow. Note that though the total cell movement cost might be non-optimal with the approximation scheme, the solution tends to favor assignments with minimal individual cell movement costs.

For two horizontally adjacent regions $b_1$ and $b_2$ ($b_1$ to the left of $b_2$), the desired area flow of $f(b_1, b_2)$ can be realized in one of two ways: Either by moving the desired units of cell area from $b_1$ to $b_2$, or by assigning the equivalent region area from $b_2$ to $b_1$. The latter implies shifting the region boundaries by suitable flow amounts, i.e. dynamic region-sizing. For movement of cells between horizontally adjacent regions, dynamic region-sizing is applied to avoid unnecessary cell movement.

While the general approach for selecting cells to be moved, as described above, is based on the quadratic movement cost of cells, other variations in cost model based on timing criticality, wirelength and pin congestion metrics may also be used in this framework.

A method for incorporating timing criticality as a cost metric that is based on assigning a cell-centric cost computed from a static timing analysis on the given netlist. In particular, from the slacks computed at each pin associated with a given cell, the worst pin-slack is used to represent the timing sensitivity (criticality) of the cell. The cells are assigned a cell-centric cost in a given cost range based on linear scaling with the cell corresponding to the worst pin-slack in the design being assigned the maximum cost. The cell-centric cost reflects the timing penalty incurred in moving a given cell from its current location. As noted, this cost may be used in lieu of the quadratic movement cost described in the general framework. Similarly, linear wirelength measure can also be used as a cost metric, by computing the increase in the wirelength incurred by moving a cell from its current location to the target location.

(b) Having selected the cells to be moved to the target region, the cells are physically moved to the most optimistic location, i.e., to the closest point in the destination region from their location in the current region, i'. Only the non-horizontal cell moves are applied at this point. The horizontal cell moves are deferred by dynamic region sizing applied on the adjacent regions in the circuit row based on the desired flow amounts. After moving the excess from the current region i' to the neighboring regions, the remaining cells may still have overlapping placements either from their initial placement locations or from the overlap that result from cells that moved into the current region i'. The cells currently assigned to region i' are removed from the layout and sorted in the increasing order of their quadratic movement cost from their original locations. The cells are inserted into the layout in the sorted order at the desired locations with local one-dimensional region-level overlap resolution through ripple-slide operation. The ripple-slide scheme pushes the movable cells to the left or the right in the circuit row to accommodate the incoming cell. The cells that have higher quadratic movement cost are inserted later to minimize their movement within region i'. It is a possible that some cells cannot be placed in a legal non-overlapping slot within the region. Such cells are placed overlapping to be resolved in the next iteration of legalization.

(c) Since there is a possibility of excess cell area movement to the neighboring regions due to discrete cell sizes, the global flow solution is locally updated to maintain the mass balance constraint at each region. The excess assignment is distributed in the out-degree of the neighboring regions, to yet unprocessed regions, based on the ratio of edge costs (least cost edge gets a larger fraction of the area excess). The incoming edges to the current active region are ignored in this operation. This local update resolves the potential capacity violations resulting from previous steps.

Step 5: Analyze the Capacity Constraint Satisfaction

Since the cell sizes are discrete, the detailed cell movement phase may fail to achieve an overlap-free placement within each region in step 4. This could leave certain regions with small excess assignments that violate capacity constraints. This is evaluated for all the regions in the network at this point.

Step 6: Iteration Condition

The global area migration solution is iterated to refine the capacity constraint violation under the following two conditions:
(a) If there exists some capacity constraint violations detected in step 5, and
(b) If the total number of iterations of the global solution already performed does not exceed a specified limit.

Step 7: Update Network Graph

If step 6 identifies more iterations of global solution to be performed, then the global network graph is updated and the solution process from step 2 is repeated.

Step 8: Local Placement Re-ordering

At this point, the placement is assumed to be legal without any overlaps. Since the legalization process thus far has realized a minimal movement based legal solution, the local placement order may need to be refined. The local placement reordering step attempts to optimize the wirelength objective while very locally perturbing the placement. This is a constrained placement optimization step that improves the quality of final placement result.

(Extension) Multi-Row-High Cell Movement

The invention also presents various approximation methods to handle movable multi-circuit row high (m by n) cells during the legalization process.

Figure 7:
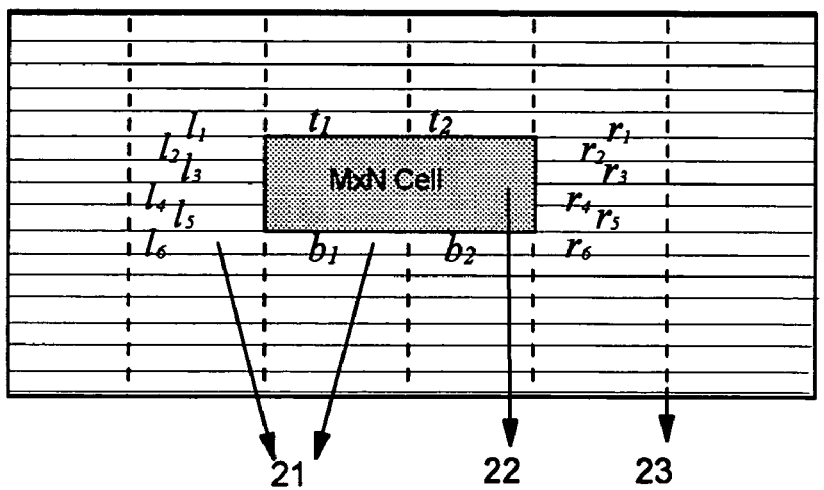
FIG. 7 is a pictorial representation of a multi-row-high cell placement.

FIG. 7 shows a placement view of an m by n cell (which spans four circuit rows) with corresponding adjoining regions to the left ($l_1, l_2, l_3, l_4, l_5$, and $l_6$), right ($r_1, r_2, r_3, r_4, r_5$, and $r_6$), top ($t_1, t_2$) and bottom ($b_1, b_2$). The figure illustrates the placement view of a movable m by n cell (22) with regions (21) defined by vertical grid (23) and circuit rows. For simplicity, a uniform vertical grid (23) is used for illustration; however, in concept an asymmetrical vertical grid could be applied. For the circuit rows across which the m by n cell spans, the edges of the m by n cell define the region boundaries.

Figure 8:
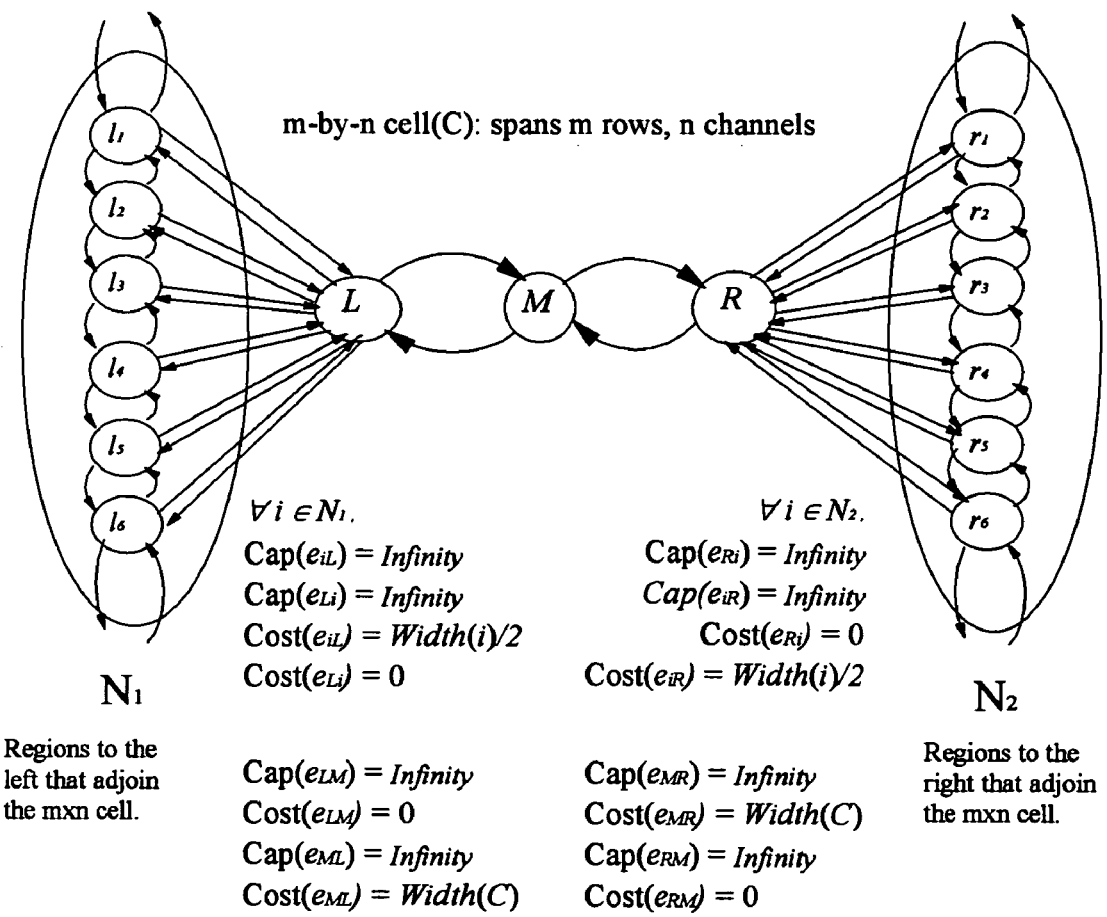
FIG. 8 shows the augmented graph model for approximate modeling of an m by n cell movement.

In FIG. 8, the augmented graph model for approximating the m by n slide operation (i.e., to maintain the circuit row level assignment while moving the cell across channels) is presented. The figure only captures the modified m by n cell model in the global graph. Nodes L, M and R jointly represent the m by n cell (horizontal view). The edges between the collection of nodes in $N_1$ (regions to the left of the m by n cell) and the node L captures the potential movement of cells along the left-edge or across the m by n cell. The cost associated with the edges from region i in the set $N_1$ to node L, represented by $Cost(e_{iL})$, is given a value of Width(i)/2, which is the average width of the corresponding region i. The reverse flow cost for edges from node L to the region i in $N_1$ is assigned a cost of zero ($Cost(e_{Li})=0$ for all i in $N_1$). Similarly edges are defined from collection of node in $N_2$ (regions to the right of the m by n cell) and the node R captures the potential movement of cells along the right-edge or across the m by n cell. Again the cost associated with the edges from region i in the set $N_2$ to node R, represented by $Cost(e_{iR})$, is given a value of Width(i)/2, which is the average width of the corresponding region i. The reverse flow cost for edges from node R to the region i in $N_2$ is assigned a cost of zero ($Cost(e_{Ri})=0$ for all i in $N_2$). To reflect the penalty of migrating cells across the m by n cell width, the edges from node M to L and from node M to R are used. The cost associated with each of these edges has a value equal to the width of the m by n cell ($Cost(e_{ML})=Cost(e_{MR})=Width(C)$, where C represents the m by n cell). The capacity of all the edges representing the m by n cell in the augmented model shown in FIG. 8 is set to infinity (i.e., a large integer value) to allow as much area migration across the m by n cells as desired by the global solution. The m by n slide movement is restricted by assigning a suitable capacity constraint in the edges associated with the augmented graph model in FIG. 8. The need for the center node M in representing the m by n cell arises to facilitate a similar approximate model for movement of the cell across circuit rows (where nodes T and B would represent the top-edge and bottom-edge of the m by n cell and similar graph with the three nodes T, M and B would be constructed). The error in per-unit area cost model of the approximation scheme for movable m by n cells is proportional to the height (number of circuit row spans) of the m by n cell for a slide operation. Therefore, this approximation is mainly suitable for relatively small movable m by n cells.

The inventive method specifies that the movable m by n cells be first fixed in location. The global area migration problem is solved by using an augmented graph to include modeling of the m by n cells. Intuitively, the augmented graph attempts to capture the effective area units(x) that migrate across the m by n cell width if the given m by n cell were fixed in location (i.e., with rigid region boundaries). The reason for introducing the three nodes L, M, and R to model the m by n cell is as follows: for the model of FIG. 8, cells are allowed to move to any adjoining region on the same side of the m by n cell (e.g., to the left region) through node L for the same cost if there is free space available in any of those regions. This cost is less than the effective cost involved in migrating x units of area across the m by n cell through nodes L, M, and R. For this instance, a cell migrates across the m by n cell only if all the free space in the adjoining regions on the left side of the m by n cell is already used up. The x units of area suffers from extra movement cost (determined by the width of the m by n cell Width(C)) to traverse across the fixed m by n cell. This non-optimality arises in lieu of fixing a priori the m by n location. Given the global area migration solution, the disclosed method pre-places the m by n cell in a good initial position. That is, if x units of area migrate across the m by n cell from left to right, then the m by n cell is moved to the right by x/m units (m being the height of the m by n cell). Once the m by n cells are pre-placed at a globally good initial position, the legalization of remaining single-circuit-row high (1 by n) cells in the design is completed based on the scheme presented in FIG. 1.

Whereas the present invention has been described in terms of a preferred embodiment, it will be understood by those skilled in the art that numerous changes and modifications to the algorithm may be introduced without departing from the spirit of the invention, all of which fall within the scope of the appended claims.

What is claimed is:

1. A method for resolving cell placement overlaps in an integrated circuit comprising the steps of:
   a) assessing an initial placement of the cell having overlapping cells;
   b) capturing a view of the placement including blockage-space and free-space to define physical regions in an image space of the integrated circuit, wherein the image space physical regions capture a two-dimensional distribution of the free-space, blockage space and placement of the cells;
   c) constructing a network flow model representing a movement of the cells between the physical regions, simultaneously in the two physical dimensions of the integrated circuit layout;
   d) solving the network flow model to determine a desired flow of the cells between the physical regions of the integrated circuit; and
   e) moving the plurality of cells simultaneously across physically neighboring regions based on the desired flow between the regions.

2. The method as recited in claim 1, wherein in step b) the physical regions defined in the image space are placement-aware to facilitate physically realizable global solutions and avoid unnecessary movement of the cells across the physical regions.

3. The method as recited in claim 1, wherein in step c) the network flow model represents a required global area migration across the image space to satisfy area capacity-demand constraints.

4. The method as recited in claim 1, wherein step e) further comprises the steps of:
   (e1) selecting the cells from each physical region to satisfy the desired flows in each direction with a minimum cost;
   (e2) physically moving the cells between the physical regions; and
   (e3) updating the desired flows locally based on an unrealized flow value.

5. The method as recited in claim 4, wherein in step e1) the selection of cells from each physical region is modeled as a generalized network flow model.

6. The method as recited in claim 4, wherein in step e1) the cells to be moved from one physical region to all neighboring regions based on the desired flow directions are selected simultaneously to minimize the total cost.

7. The method as recited in claim 4, wherein in step e1) an approximation algorithm is provided for selecting the cells from one physical region to be moved with minimum cost.

8. The method as recited in claim 4, wherein in step e1) the cost of the cell movements is computed by executing a method selected from the group consisting of: quadratic movement cost, liner movement cost, timing sensitivity or criticality, linear wirelength change and pin congestion measure.

9. The method as recited in claim 4, wherein in step e2) the cells are moved to target regions while determining a detailed physical location of the cells that are moved.

10. The method as recited in claim 9, wherein the cells are placed at the closest physical location in the target region from the original region using ripple-slide operation to resolve local overlaps resulting thereof.

11. The method as recited in claim 4, wherein in step e2) the regions are dynamically resized to accommodate the horizontal movement of the cells.

12. The method as recited in claim 4, wherein in step e3) the desired flows from the target regions are locally updated to account for excess assignments resulting from discrete cell sizes.

13. The method as recited in claim 1, further comprising the steps of
   (f) updating a network flow model by iterating steps (d) and (e) to converge to a solution that satisfies all capacity-demand constraints.
   (g) providing a local re-ordering of the cells to minimize a linear wirelength metric; and
   (h) approximately modeling the movement of multi-row high cells using an augmented network flow model.

14. The method as recited in claim 13, wherein in step g) the new position of the cells is achieved by swapping cells within a local region to minimize the linear wirelength.

15. The method as recited in claim 13, wherein in step h) the augmented network flow graph approximately models the presence and the movement of multi-row high cells along with single-row high cells.

16. The method as recited in step h) of claim 13, further comprising the steps of:
   h1) solving the augmented network flow model to include multi-row high cells;
   h2) pre-placing multi-row high cells at a an initial location based on a global solution; and
   h3) executing steps (b) through (e) to legalize the single-row high cells.

17. The method as recited in claim 13, wherein in step e1) the cost of cell movement in the general framework is computed by executing a method selected from the group consisting of: quadratic movement cost, linear movement cost, timing sensitivity or criticality, linear wirelength change and pin congestion measure.

18. A program storage device readable by a machine, tangibly, embodying a program of instructions executable by the machine to perform method steps for performing static timing analysis of a digital system in the presence of a plurality of global sources of delay variation, said method steps comprising:
   a) assessing an initial placement of the cell having overlapping cells;
   b) capturing a view of the placement including blockage-space and free-space to define physical regions in an image space of the integrated circuit, wherein the image space physical regions capture a two-dimensional distribution of the free-space, blockage space and placement of the cells;
   c) constructing a network flow model representing a movement of the cells between the physical regions, simultaneously in the two physical dimensions of the integrated circuit layout;

d) solving the network flow model to determine a desired flow of the cells between the physical regions of the integrated circuit; and e) moving the plurality of cells simultaneously across physically neighboring regions based on the desired flow between the regions.

19. A method for resolving cell placement overlaps in an integrated circuit layout comprising the steps of:

a) creating a network flow graph of an initial placement that includes cell overlaps for modeling a movement of a plurality of cells simultaneously in two physical dimensions, both across and within circuit rows of the integrated circuit layout;

b) solving the network flow graph for computing a desired migration of cell-area across the integrated circuit layout from regions with the overlapping cells to regions with free-space;

c) evaluating the direction and amount of cell-area to be migrated between physically neighboring regions in a two-dimensional image, based on the network flow graph solution;

d) simultaneously moving the plurality of cells across physically neighboring regions based on the evaluated direction and area migration flow between the physically neighboring regions;

e) analyzing the physical regions for overlap detection by verifying the total cell area in each physical region to be less than or equal to its physical capacity limit; and f) repeating steps a) through e) until the cell overlaps has been resolved or a predetermined number of iterations has been completed.

* * * * *